US012802735B2

(12) United States Patent
Chang

(10) Patent No.: US 12,802,735 B2
(45) Date of Patent: Nov. 17, 2026

(54) CONTROL MODULE AND CONTROL METHOD THEREOF FOR SYNCHRONOUS DYNAMIC RANDOM ACCESS MEMORY

(71) Applicant: REALTEK SEMICONDUCTOR CORPORATION, Hsinchu (TW)

(72) Inventor: Ya-Min Chang, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 152 days.

(21) Appl. No.: 18/919,186

(22) Filed: Oct. 17, 2024

(65) Prior Publication Data

US 2025/0140301 A1 May 1, 2025

(30) Foreign Application Priority Data

Oct. 26, 2023 (TW) ................................ 112140979

(51) Int. Cl.
*G11C 11/406* (2006.01)
*G11C 11/4096* (2006.01)

(52) U.S. Cl.
CPC .. *G11C 11/40618* (2013.01); *G11C 11/40622* (2013.01); *G11C 11/4096* (2013.01)

(58) Field of Classification Search
CPC ............................................... G11C 11/40618
See application file for complete search history.

(56) References Cited

U.S. PATENT DOCUMENTS

2022/0206684 A1* 6/2022 Chang .................. G06F 3/0659

FOREIGN PATENT DOCUMENTS

TW I779444 B 10/2022
WO WO-2023149897 A1 * 8/2023 ....... G11C 11/40618

* cited by examiner

*Primary Examiner* — Jason Lappas
(74) *Attorney, Agent, or Firm* — WPAT, P.C.; Anthony King

(57) ABSTRACT

The present disclosure provides a control module and a control method thereof for an SDRAM. The control module includes at least one register and a controller. The controller is electrically connected to the at least one register and configured to: set values of the at least one register; perform a refresh all bank instruction; and after executing the refresh all bank instruction, perform a DPIN operation based on the value of the at least one register.

18 Claims, 9 Drawing Sheets

CONTROL MODULE AND CONTROL METHOD THEREOF FOR SYNCHRONOUS DYNAMIC RANDOM ACCESS MEMORY

CROSS REFERENCE TO RELATED APPLICATIONS

This application claims priority of Taiwan application No. 112140979 filed on Oct. 26, 2023, which is incorporated by reference in its entirety.

BACKGROUND

Field of the Invention

The present disclosure relates to control modules and methods for memory, and more particularly to a control module and a control method thereof for synchronous dynamic random access memory.

Description of Related Art

In a synchronous dynamic random access memory (SDRAM) framework, an SDRAM controller executes instructions and controls data channels. The development of a process of manufacturing conventional SDRAM controllers is usually carried out according to the instructions to execute and specific functions. However, from the perspective of developed SDRAM controllers, defects, flaws and/or errors in the operations (especially operations with special functions) of the SDRAMs can hardly be verified or even be corrected with any other methods.

Both Taiwan patent application 202226244 published on Jul. 1, 2022 and U.S. patent application 2022/0206684 published on Jun. 30, 2022 disclose a dynamic pin (DPIN) operation for mitigating the aforesaid drawback.

BRIEF SUMMARY OF THE INVENTION

Some embodiments of the present invention provide a control method for a synchronous dynamic random access memory (SDRAM). The method includes: setting values of at least one register for a dynamic pin (DPIN) operation; performing a refresh-all-bank instruction; and performing the DPIN operation according to the values of the at least one register after performing the refresh-all-bank instruction.

Some embodiments of the present invention provide a control module for SDRAM. The control module includes: at least one register and a controller. The at least one register stores values for a DPIN operation. The controller is electrically connected to the at least one register and configured to: set the values of the at least one register; perform a refresh-all-bank instruction; and perform the DPIN operation according to the values of the at least one register after performing the refresh-all-bank instruction.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Embodiments of the disclosure will be described in detail below. However, it should be understood that the disclosure provides concepts widely applied to and embodied in specific situations. The specific embodiments of the disclosure are illustrative rather than restrictive of the scope of the disclosure.

A conventional synchronous dynamic random access memory (SDRAM) framework lacks usage flexibility, and thus defects, flaws and/or errors in SDRAM operation can hardly be verified or even be corrected with any other methods. The disclosure provides a control module and a control method thereof for dynamically executing a dynamic pin (DPIN) operation during SDRAM operation to enhance the operation flexibility of the SDRAM framework with a view to mitigating the aforesaid drawback of the prior art. Please refer to Taiwan patent application 202226244 published on Jul. 1, 2022 and U.S. patent application 2022/0206684 published on Jun. 30, 2022 for details of the DPIN operation.

Figure 1A:
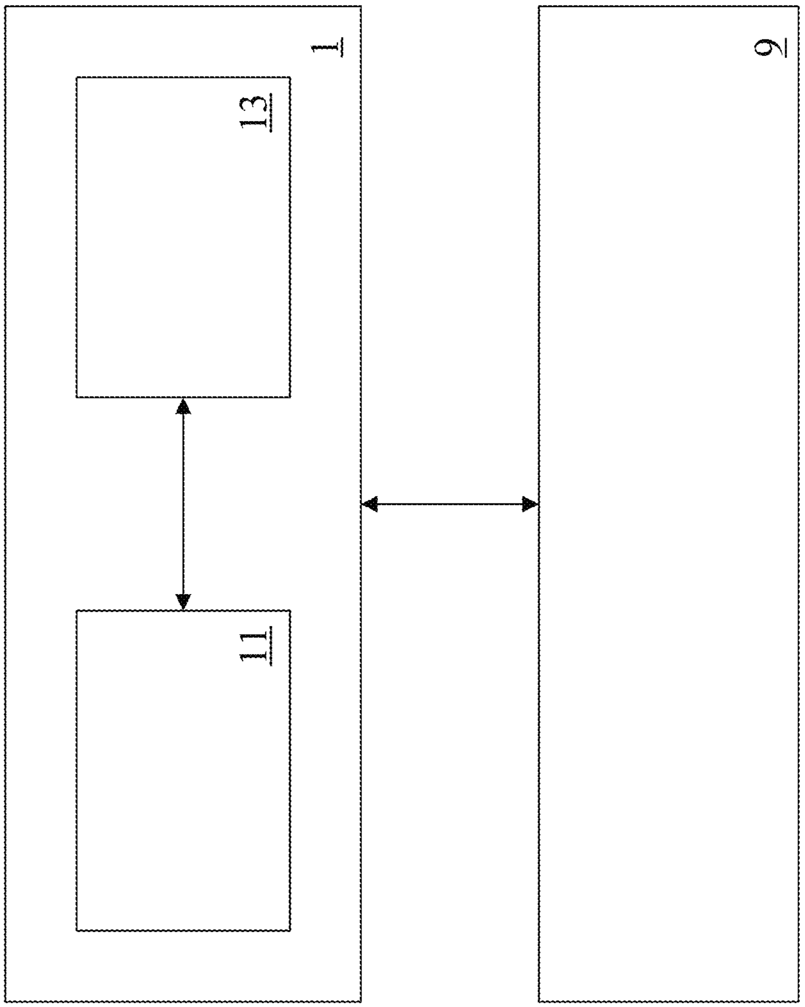
FIG. 1A is a block diagram of a control module according to some embodiments of the present disclosure.

FIG. 1A illustrates a block diagram of a control module 1 in some embodiments of the disclosure. The control module 1 includes at least one register 11 and a controller 13. The register 11 is electrically connected to the controller 13. The control module 1 is electrically connected to an SDRAM 9. Data and signals are transmitted between the components via electrical connection. Related control operation is further described below.

Figure 1B:
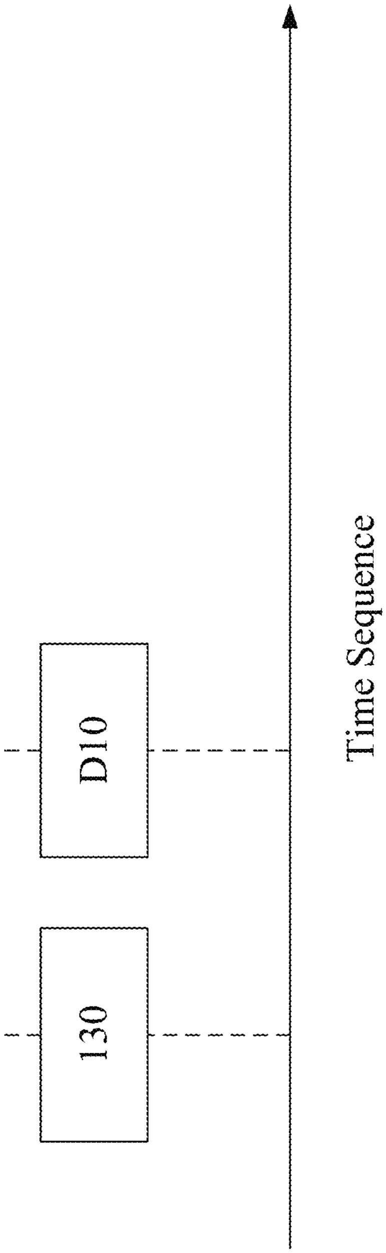
FIG. 1B is a time sequence diagram of performing instructions by the controller according to some embodiments of the present disclosure.

FIG. 1B illustrates a time sequence diagram of performing instructions by the controller 13 in some embodiments of the disclosure. In some embodiments, the at least one register 11 stores values for a DPIN operation D10, and a user sets the values of the at least one register 11 for the controller 13 to perform the DPIN operation D10. After the values required for the DPIN operation D10 has been set, the controller 13 is configured to perform a refresh-all-bank instruction 130 (for example, REFab instruction in a memory specification) and perform the DPIN operation D10 according to the values of the at least one register 11 after performing the refresh-all-bank instruction 130. Accordingly, the control module 1 of the disclosure enables the performance of the DPIN operation D10 to follow the performance of the refresh-all-bank instruction 130 during the operation of the SDRAM 9, allowing the DPIN operation D10 to be dynamically executed as needed.

Figure 2A:
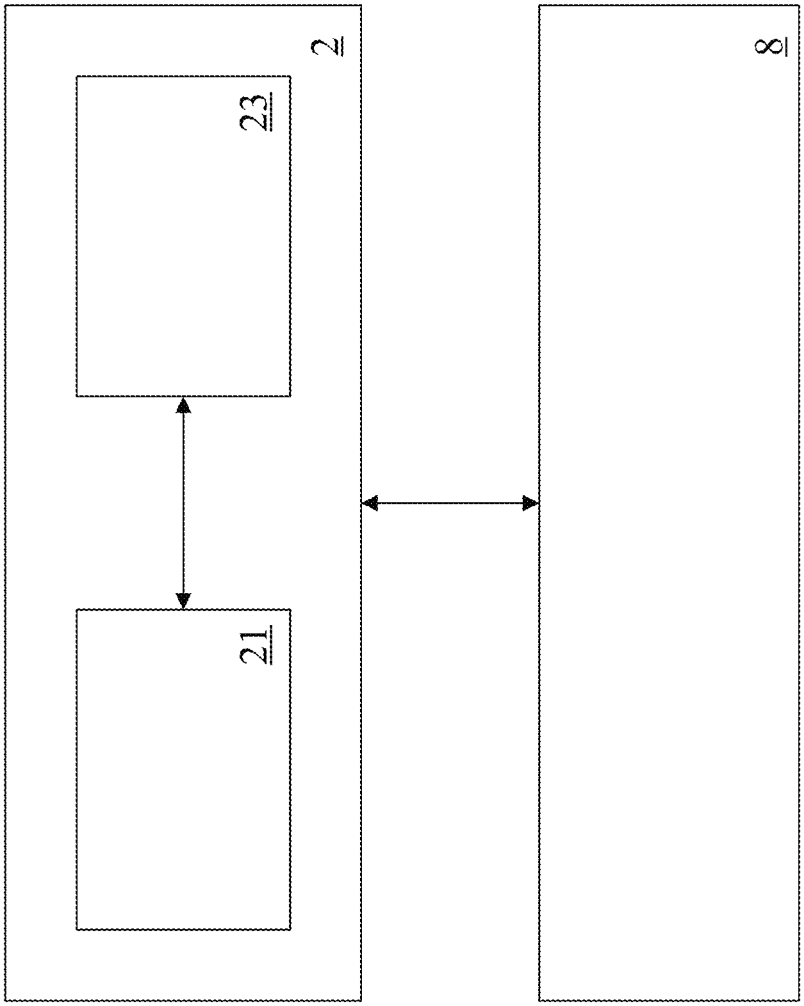
FIG. 2A is a block diagram of a control module according to some embodiments of the present disclosure.

FIG. 2A illustrates a block diagram of a control module 2 in some embodiments of the disclosure. The control module 2 includes at least one register 21 and a controller 23. The register 21 is electrically connected to the controller 23. The control module 2 is electrically connected to an SDRAM 8. Data and signals are transmitted between the components via electrical connection. Related control operation is further described below.

Figure 2B:
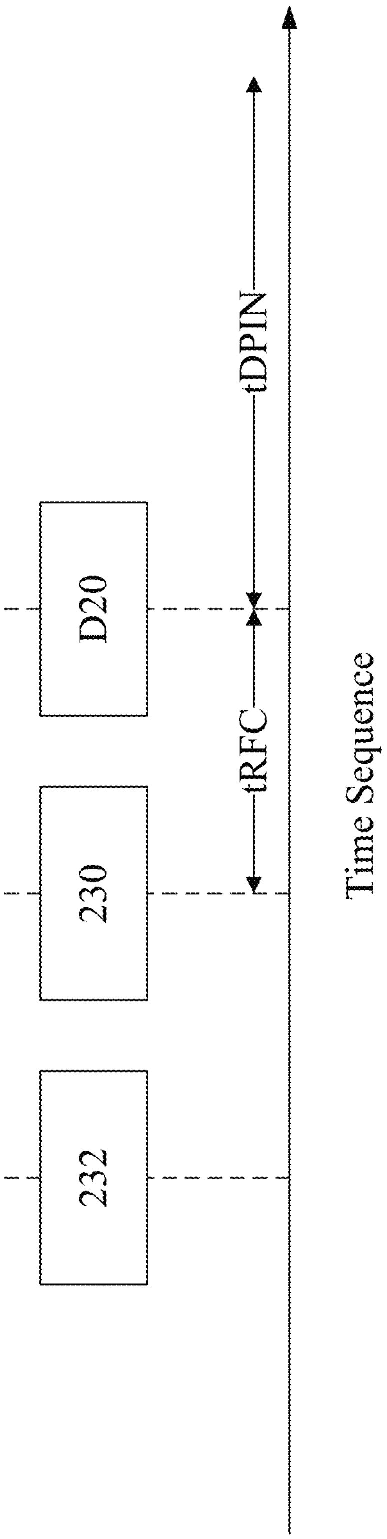
FIG. 2B is a time sequence diagram of performing instructions by the controller according to some embodiments of the present disclosure.

FIG. 2B illustrates a time sequence diagram of performing instructions by the controller 23 in some embodiments of the disclosure. In some embodiments, the at least one register 21 (or multiple registers) store values for a DPIN operation D20, and a user sets the values of the at least one register 21 for the controller 23 to perform the DPIN operation D20. In some embodiments, because the DPIN operation D20 is configured to be performed after a refresh-all-bank instruction, the pull-in performance of the refresh-all-bank instruction can be carried out in order for the pull-in performance of the DPIN operation D20 to occur.

In some embodiments, after the controller 23 has set the values of the at least one register 21 (implying a need to execute the DPIN operation D20), the controller 23 determines to carry out the pull-in performance of a refresh-all-bank instruction 230 in a corresponding refresh bank interval (for example, tREFi interval in a memory specification). Then, the controller 23 sequentially performs a memory pre-charge-all-bank instruction 232 (for example, PRECHA instruction in a memory specification) corresponding to the refresh-all-bank instruction 230 and the refresh-all-bank instruction 230 according to the pull-in performance of the refresh-all-bank instruction 230. Next, upon performance the refresh-all-bank instruction 230 and passing through a refresh instruction cycle tRFC, the controller 23 is configured to performs the DPIN operation D20 according to the values of the at least one register 21.

In some embodiments, the performance of the DPIN operation D20 may cause some changes to the SDRAM 8, and thus a memory recovery information related to the status of the SDRAM 8 has to be stored prior to the performance of the DPIN operation D20 such that, upon completion of the DPIN operation D20, the controller 23 restores the SDRAM 8 to its status before the performance of the DPIN operation D20 in accordance with the memory recovery information In some embodiments, the controller 23 is configured to confirm whether the DPIN operation D20 is complete. If the controller 23 confirms that the DPIN operation D20 is complete, the controller 23 is configured to perform the next SDRAM instruction after a DPIN performance interval tDPIN has ended. If the controller 23 confirms that the DPIN operation D20 is not complete, the controller 23 is configured to repeatedly confirm whether the DPIN operation D20 is complete.

Figure 2C:
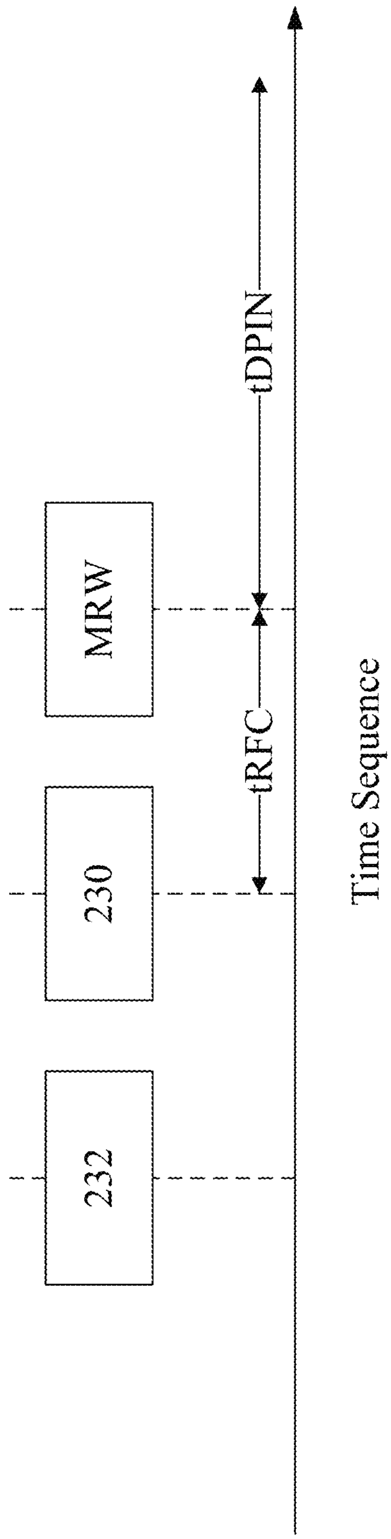
FIG. 2C is a time sequence diagram of performing instructions by the controller according to some embodiments of the present disclosure.

FIG. 2C illustrates a time sequence diagram of performing instructions by the controller 23 in some embodiments of the disclosure. In some embodiments, after the controller 23 performs the refresh-all-bank instruction 230 and passing through the refresh instruction cycle tRFC, the controller 23 is configured to perform a DPIN instruction according to the values of the at least one register 21. The DPIN instruction includes a mode register write (MRW) instruction.

Figure 2D:
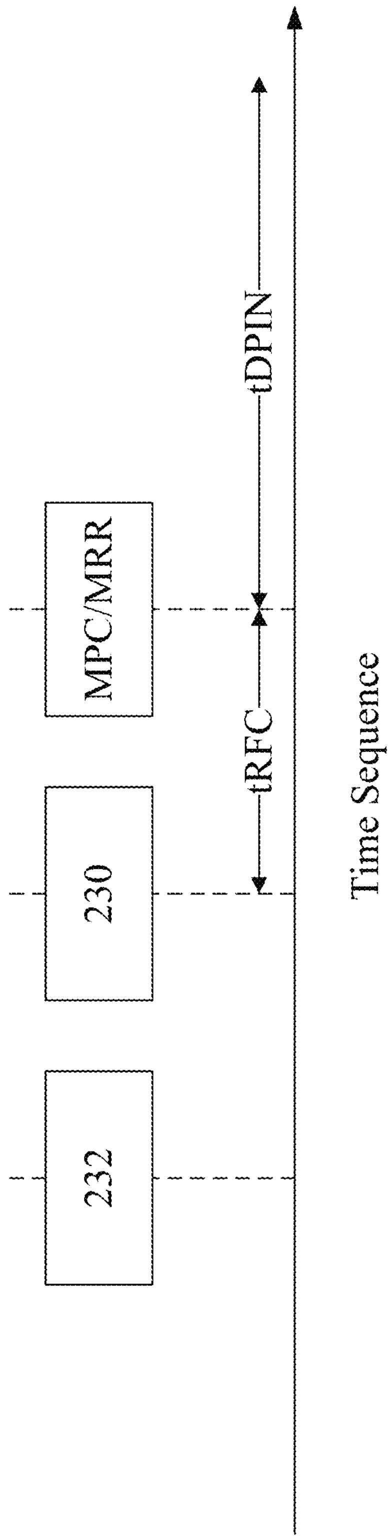
FIG. 2D is a time sequence diagram of performing instructions by the controller according to some embodiments of the present disclosure.

FIG. 2D illustrates a time sequence diagram of performing instructions by the controller 23 in some embodiments of the disclosure. In some embodiments, after the controller 23 performs the refresh-all-bank instruction 230 and passing through the refresh instruction cycle tRFC, the controller 23 is configured to perform a DPIN instruction according to the values of the at least one register 21. The DPIN instruction includes one of a mode register read (MRR) instruction and a multi-purpose command (MPC).

Figure 2E:
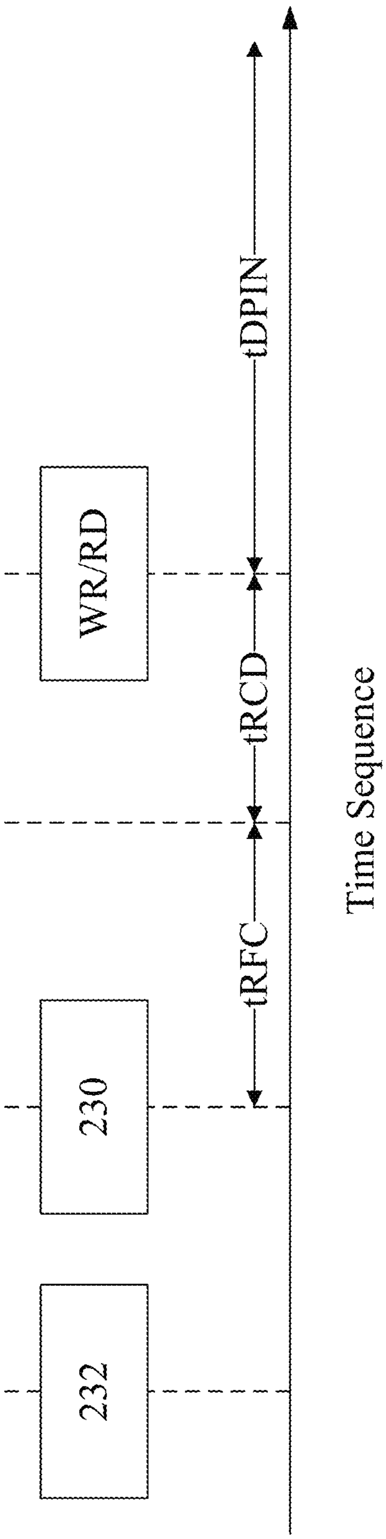
FIG. 2E is a time sequence diagram of performing instructions by the controller according to some embodiments of the present disclosure.

FIG. 2E illustrates a time sequence diagram of execution of instructions by the controller 23 in some embodiments of the disclosure. In some embodiments, after the controller 23 performs the refresh-all-bank instruction 230 passing through the refresh instruction cycle tRFC and an address search delay time tRCD, the controller 23 is configured to perform a DPIN instruction according to the values of the at least one register 21. The DPIN instruction includes one of an active instruction, a read instruction RD and a write instruction WR.

For example, the DPIN operation includes a memory temperature surveillance. In particular, when the SDRAM 8 is halfway through its operation and thus its operating temperature has to be confirmed to adjust SDRAM-related parameters (for example, change the bank refresh rate from 7.8 μs to 3.9 μs) in accordance with the confirmed operating temperature, the controller 23 sets the values of the at least one register 21 to facilitate subsequent performance of a corresponding DPIN operation (i.e., a memory temperature surveillance). Then, the controller 23 determines to carry out the pull-in performance of the refresh-all-bank instruction 230 in a corresponding refresh bank interval. Next, the controller 23 sequentially performs the memory pre-charge-all-bank instruction 232 and the refresh-all-bank instruction 230. After performing the refresh-all-bank instruction 230 and passing through the refresh instruction cycle tRFC, the controller 23 performs the memory temperature surveillance according to the numerical value of the at least one register 21 to confirm the temperature of the SDRAM 8. In some embodiments, the temperature of the SDRAM 8 is confirmed with a temperature sensing chip disposed on the SDRAM 8. In some embodiments, the temperature of the SDRAM 8 is confirmed with a temperature sensor positioned proximate to the SDRAM 8.

Figure 3:
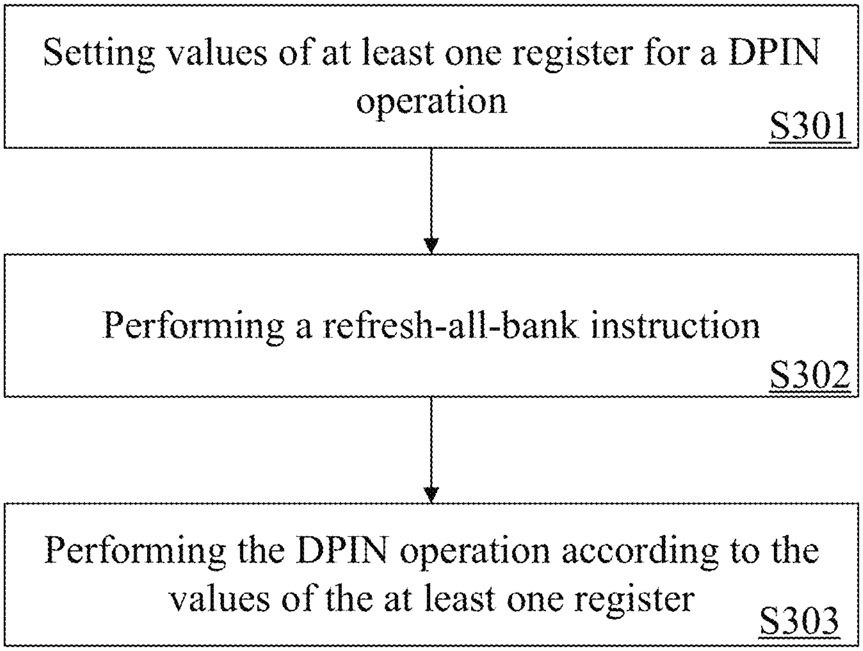
FIG. 3 is a flowchart of a control method for SDRAMs according to some embodiments of the present disclosure.

Some embodiments of the disclosure provide a control method for SDRAMs, and its flow chart is shown in FIG. 3. A control method in the embodiments is carried out with a control module (for example, the control module in the aforesaid embodiments) and described below. Step S301 is executed to set values of at least one register for a DPIN operation. Step S302 is executed to perform a refresh-all-bank instruction. Step S303 is executed to perform the DPIN operation according to the values of the at least one register after performing the refresh-all-bank instruction.

Figure 4:
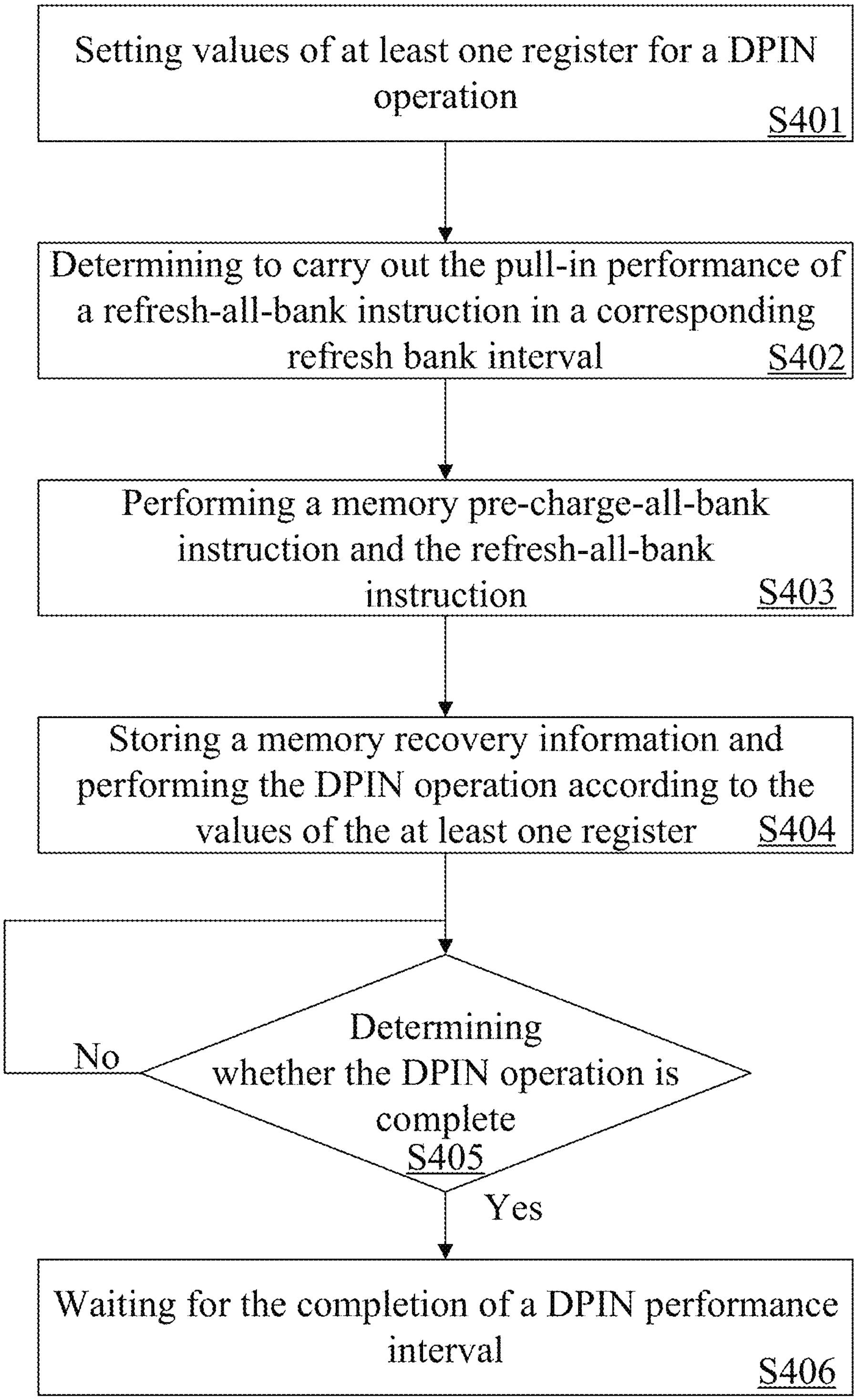
FIG. 4 is a flowchart of a control method for SDRAMs according to some embodiments of the present disclosure.

Some embodiments of the disclosure provide a control method for SDRAMs, and its flow chart is shown in FIG. 4. The control method in the embodiments is carried out with a control module (for example, the control module in the aforesaid embodiments), and its steps are described below.

Step S401 is executed to set values of at least one register for a DPIN operation. Step S402 is executed to determine to carry out the pull-in performance of a refresh-all-bank instruction in a corresponding refresh bank interval. Step S403 is executed to perform a memory pre-charge-all-bank instruction and the refresh-all-bank instruction. Step S404 is executed to store a memory recovery information and performing the DPIN operation according to the values of the at least one register.

Step S405 is executed to determine whether the DPIN operation is complete. If it is confirmed that the DPIN operation is complete, step S406 is executed to wait for the completion of a DPIN performance interval. If it is confirmed that the DPIN operation is not complete, step S405 is repeatedly executed to confirm whether the DPIN operation is complete.

In conclusion, a control module and a control method thereof for SDRAMs, as provided by the disclosure, are effective in executing a dynamic pin (DPIN) operation dynamically during an SDRAM operation to flexibly improve the ease of the SDRAM operation (especially operations with special functions). In some embodiments, the controller comprises a logic circuit for executing computation and instructions, without limiting the embodiment of the hardware of the disclosure.

While this invention has been described with specific embodiments thereof, it is evident that many alternatives, modifications, and variations may be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the invention by simply employing the elements of the independent claims. Accordingly, embodiments of the invention as set forth herein are intended to be illustrative, not limiting. Various changes may be made without departing from the spirit and scope of the invention.

What is claimed is:

1. A control method for a synchronous dynamic random access memory (SDRAM), comprising:

setting values of at least one register for a dynamic pin (DPIN) operation;

performing a refresh-all-bank instruction after setting the values of the at least one register;

determining to carry out pull-in performance of the refresh-all-bank instruction in a corresponding refresh bank interval; and performing the DPIN operation according to the values of the at least one register after performing the refresh-all-bank instruction.

2. The control method of claim 1, wherein performing the refresh-all-bank instruction further comprises performing a memory pre-charge-all-bank instruction and the refresh-all-bank instruction.

3. The control method of claim 1, further comprising storing a memory recovery information.

4. The control method of claim 1, further comprising determining completion of the DPIN operation.

5. The control method of claim 1, wherein performing the DPIN operation according to values of the at least one register further comprises:

performing a DPIN instruction according to the values of the at least one register, wherein the DPIN instruction comprising a mode register write instruction.

6. The control method of claim 1, wherein performing the DPIN operation according to the values of the at least one register further comprises:

performing a DPIN instruction according to the values of the at least one register, wherein the DPIN instruction comprising one of a mode register read instruction and a multi-purpose command.

7. The control method of claim 1, wherein performing the DPIN operation according to the values of the at least one register further comprises:

performing a DPIN instruction according to the values of the at least one register, wherein the DPIN instruction comprising one of an active instruction, a read instruction and a write instruction.

8. The control method of claim 1, wherein performing the DPIN operation according to the values of the at least one register after performing the refresh-all-bank instruction further comprises:

performing the DPIN operation according to the values of the at least one register after performing the refresh-all-bank instruction and passing through a refresh instruction cycle.

9. The control method of claim 1, wherein the DPIN operation comprises a memory temperature surveillance.

10. A control module for synchronous dynamic random access memory (SDRAM), comprising:

at least one register for storing values for a dynamic pin (DPIN) operation;

a controller electrically connected to the at least one register and configured to:

set the values of the at least one register;

perform a refresh-all-bank instruction after setting the values of the at least one register;

determine to carry out pull-in performance of the refresh-all-bank instruction in a corresponding refresh bank interval; and perform the DPIN operation according to the values of the at least one register after performing the refresh-all-bank instruction.

11. The control module of claim 10, wherein the controller further performs a memory pre-charge-all-bank instruction and the refresh-all-bank instruction.

12. The control module of claim 10, wherein the controller stores a memory recovery information in another register.

13. The control module of claim 10, wherein the controller further determines completion of the DPIN operation.

14. The control module of claim 10, wherein the controller further performs a DPIN instruction according to the values of the at least one register, and the DPIN instruction comprises a mode register write instruction.

15. The control module of claim 10, wherein the controller further performs a DPIN instruction according to the values of the at least one register, and the DPIN instruction comprises one of a mode register read instruction and a multi-purpose command.

16. The control module of claim 10, wherein the controller further performs a DPIN instruction according to the values of the at least one register, and the DPIN instruction comprising one of an active instruction, a read instruction and a write instruction.

17. The control module of claim 10, wherein the controller further performs the DPIN operation according to the values of the at least one register after performing the refresh-all-bank instruction and passing through a refresh instruction cycle.

18. A control module for synchronous dynamic random access memory (SDRAM), comprising:

at least one register for storing values for a dynamic pin (DPIN) operation;

a controller electrically connected to the at least one register and configured to:

set the values of the at least one register;

perform a refresh-all-bank instruction; and perform the DPIN operation according to the values of the at least one register after performing the refresh-all-bank instruction, wherein the DPIN operation comprises a memory temperature surveillance.

* * * * *